United States Patent [19]

Choi

[11] Patent Number: 5,101,201

[45] Date of Patent: Mar. 31, 1992

[54] APPARATUS FOR CONVERTING SCAN DATA OF A KEYBOARD

[75] Inventor: Woo-Sung Choi, Suwon, Rep. of Korea

[73] Assignee: SamSung Electronics Co., Ltd., Suwon, Rep. of Korea

[21] Appl. No.: 524,287

[22] Filed: May 16, 1990

[30] Foreign Application Priority Data

May 17, 1989 [KR] Rep. of Korea ................. 1989-6587

[51] Int. Cl.$^5$ .......................................... H03K 17/94
[52] U.S. Cl. ....................................... 341/22; 341/23; 341/26
[58] Field of Search ....................... 341/22, 23, 26, 90, 341/91, 92

[56] References Cited

U.S. PATENT DOCUMENTS

| | | | |
|---|---|---|---|
| 3,228,004 | 1/1966 | McGregor | 341/90 X |
| 3,518,657 | 6/1970 | Zinn et al. | 341/90 X |
| 3,631,455 | 12/1971 | Gregg | 341/90 X |
| 4,006,463 | 2/1977 | Hanks | 341/90 X |
| 4,645,916 | 2/1987 | Raisleger | 341/90 X |

OTHER PUBLICATIONS

Kuhar, E., "General Keyboard Translator Adapter", IBM Technical Disclosure Bulletin, vol. 20, No. 8, Jan. 1978, pp. 2935-2936.

Primary Examiner—Ulysses Weldon
Attorney, Agent, or Firm—Robert E. Bushnell

[57] ABSTRACT

There is disclosed a circuit for converting scan data comprising a key matrix switch having multiple keys and multiple mode selecting switches for producing scan data when one of said keys is activated, a scan decoder for decoding said scan data to produce a mode selecting signal, first scan data, second scan data, and first and second clock signals respectively synchronized with said first and second scan data, first and second latch circuits for latching said first and second scan data according to said first and second clock signals, and a mode selecting adder for converting the first and second latched output data of said first and second latch circuits into the first and second converted scan data according to the mode selecting signal of said scan decoder, whereby scan data of a different modes may be produced according to the operation of said mode selecting switches.

6 Claims, 3 Drawing Sheets

APPARATUS FOR CONVERTING SCAN DATA OF A KEYBOARD

TECHNICAL BACKGROUND

The present invention generally relates to an apparatus for producing scan data by employing a scan key matrix, and more particularly to an apparatus for converting the scan data in which the apparatus provides a variety of operational modes by using an additional mode selecting switch.

Generally, electronic machines to control the various functions thereof have a scan key matrix which enables the machines to arrange the maximum number of keys in the minimum area. Such a scan key matrix circuit usually converts into a binary data of given bits the data selected by one of the multiple keys arranged in a switch block, that is finally activated. The conventional scan key matrix circuit can produce only the scan data of the operational mode depending on the number of the cross points where the rows cross the columns in the matrix, and therefore there is caused the drawback that the number of the keys constituting the scan key matrix limits the number of the output data.

Referring to FIG. 1, the conventional scan data conversion circuit includes a key matrix 12 for producing scan data SD, a scan decoder 14 for decoding the scan data SD, and the first and the second latches 16 and 18 for latching the scan data decoded by the scan decoder 14.

The scan data output from the conventional scan data conversion circuit is transmitted to a key data processing section (not shown) to control the workings and functions of the system. When applied to a scan data conversion system, the conventional scan data conversion circuit is disadvantageous in that an additional scan data conversion circuit must be provided to expand the operational modes of the key matrix switch.

SUMMARY OF THE INVENTION

It is therefore an object of the present invention to provide a scan data conversion circuit having a mode selecting switch in addition to the key matrix so as to convert the format of the output scan data according to the switching state of the mode selecting switch.

According to one aspect of the present invention, a circuit for converting scan data includes: a key matrix switch having multiple keys and multiple mode selecting switches for producing the scan data when one of the keys is activated; a scan decoder for decoding the scan data to produce a mode selecting signal, a first scan data, a second scan data, and a first and a second clock signals respectively synchronized with the first and second scan data; first and second latch circuits for latching the first and second scan data according to the first and second clock signals; and a mode selecting adder for converting the first and second latched output data of the first and second latch circuits into a first and second converted scan data according to the mode selecting signal of the scan decoder, whereby scan data of different modes may be produced according to the operation of the mode selecting switches.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 2:
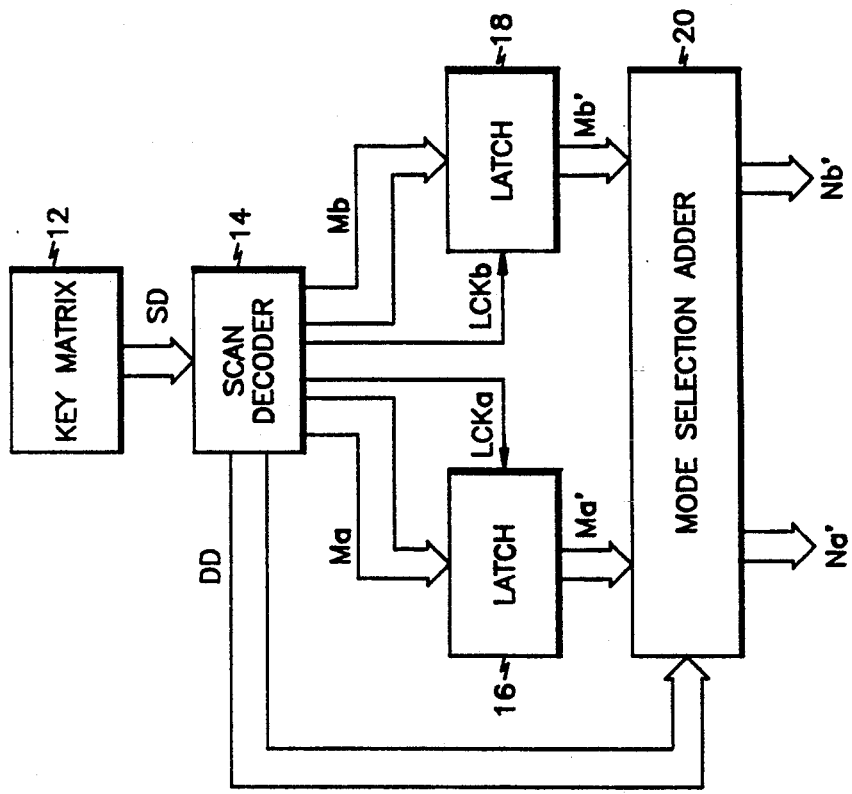
FIG. 2 is a schematic diagram for illustrating a scan data conversion circuit according to the present invention.
Figure 1:
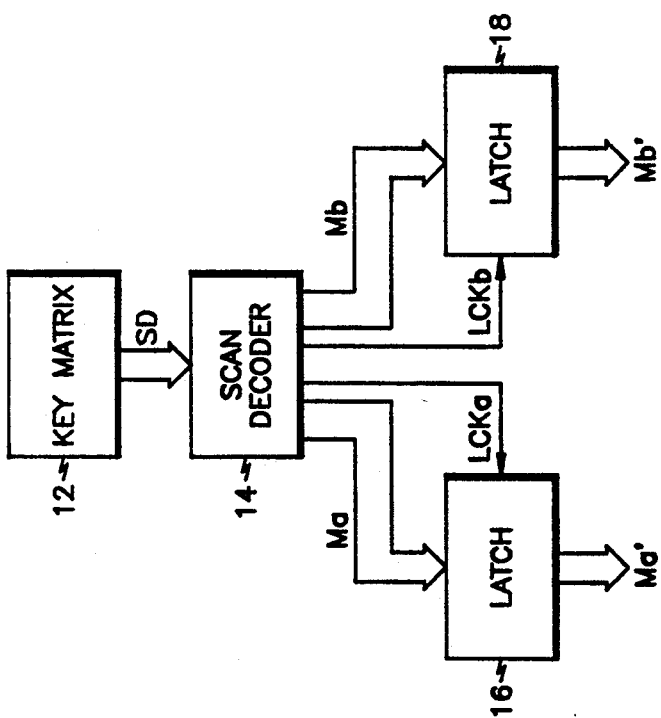
FIG. 1 is a schematic diagram for illustrating a conventional scan data conversion circuit.

The present invention will now be described more specifically with reference to the drawings attached only by way of example. Throughout the specification, the same symbols and the equivalent part are described in the same reference numerals.

Referring to FIG. 2 for illustrating a scan data conversion circuit according to the present invention, a key matrix 12 has one key at each of the cross points where the rows cross the columns, and a given number of option switches, so as to produce the scan data SD when one of the keys is activated.

A scan decoder 14 decodes the scan data to produce a mode selecting data DD, a first scan data Ma, a second scan data Mb, and first and second clock signals LCKa and LCKb which are respectively synchronized with the first and second scan data Ma and Mb.

First and second latch circuits 16 and 18 latch the first and second scan data Ma and Mb according to first and second clock signals LCKa and LCKb.

A mode selection adder (option adder) 20 converts the first and second latched output data Ma' and Mb' first and second latch circuits 16 and 18 into the first and second scan conversion data Na' and Nb' according to the mode selecting data DD scan decoder The first and second data Ma and Mb are binary data of n bits, and the mode selecting data DD is the data to control the scan data conversion mode (hereinafter referred to as option data), having the bit states of $OP_1$, $OP_2$, $OP_3$ and up/down ($U/D_A$, $U/D_B$).

Figure 3:
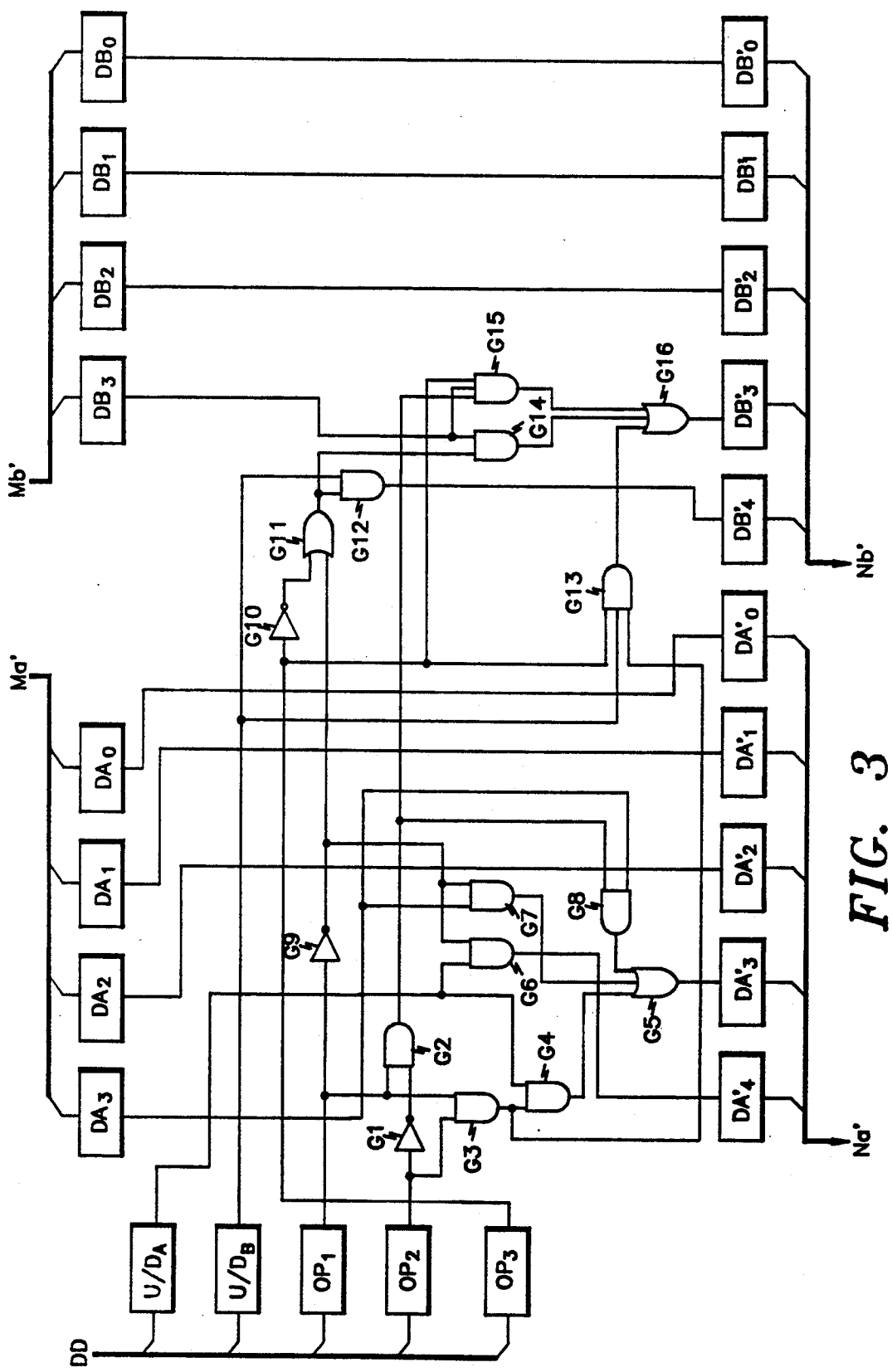
FIG. 3 is a detailed diagram of the option adder key of FIG. 2.

Referring to FIG. 3, mode selection adder 20 includes an option state determining section including multiple inverters $G_1$, $G_9$, $G_{10}$, AND gates $G_2$, $G_3$, $G_{13}$ and OR gate $G_{11}$, first data ($Ma'$) conversion section including multiple AND gates $G_4$, $G_6$, $G_7$, $G_8$ and OR gate $G_5$, and second data ($Mb$) conversion section including multiple AND gates $G_{12}$, $G_{14}$, $G_{15}$ and OR gate $G_{16}$.

Hereinafter the operation of the inventive structure will be described. The key matrix 12 is assumed to have 7×6 matrix structure and the key arrangement as shown in Table 1.

TABLE 1

| $A_0$ | $A_1$ | $A_2$ | $A_3$ | $A_4$ | $A_5$ | $A_6$ |
| --- | --- | --- | --- | --- | --- | --- |
| $A_7$ | $A_8$ | $A_9$ | $A_{10}$ | $A_{11}$ | $A_{12}$ | $A_{13}$ |
| $A_{14}$ | $A_{15}$ | $U/D_A$ | X | $OP_1$ | $OP_2$ | $OP_3$ |
| $B_0$ | $B_1$ | $B_2$ | $B_3$ | $B_4$ | $B_5$ | $B_6$ |
| $B_7$ | $B_8$ | $B_9$ | $B_{10}$ | $B_{11}$ | $B_{12}$ | $B_{13}$ |
| $B_{14}$ | $B_{15}$ | $U/D_B$ | X | X | X | X |

Namely, it is assumed that the key matrix 12 includes group A switches $A_0$–$A_{15}$, group B switches $B_0$–$B_{15}$, group A up/down switch $U/D_A$, group B up/down switch $U/D_B$, and option switches $OP_1$, $OP_2$, $OP_3$, as shown in Table 1. In this case, the option data DD produced by the scan decoder 14 is 5-bit data including the data of $U/D_A$, $U/D_B$, $OP_1$, $OP_2$, $OP_3$ that each have a given logic level of 1 or 0. The table 2 shown below represents the states of the mode that may be selected according to the state of the option data $OP_1$, $OP_2$, $OP_3$.

TABLE 2

| Na' | Nb' | $OP_1$ | $OP_2$ | $OP_3$ |
|---|---|---|---|---|
| 16U/D | 16U/D | 0 | X | X |
| 16 | 16U/D | 1 | 0 | 0 |
| 16 | 16 | 1 | 0 | 1 |
| 8U/D | 16U/D | 1 | 1 | 0 |
| 8U/D | 8U/D | 1 | 1 | 1 |

The switching state of each switching group is represented by the first and second data Ma and Mb formed of 4-bit data, whose format is presented by the data of $DA_3$, $DA_2$, $DA_1$, $DA_0$ for the first data Ma and by $DB_3$, $DB_2$, $DB_1$, $DB_0$ for the second data Mb. Hence, if the group A and B switches are used for 16 switches without operation of the up/down key, the data format will be as shown in Table 3. If the up/down key is used for each of the 16 group data, the data format is as shown in Table 4. If the up/down key is used for each of the 8 group data, the data format is as shown in Table 5. In Tables 3–5, the input data Ma' and Mb' are supplied to mode selection adder 20, while the output data Na' and Nb' are produced by mode selection adder 20.

TABLE 3

| S.W. STATES | Ma Mb | $DA_3$ $DB_3$ | $DA_2$ $DB_2$ | $DA_1$ $DB_1$ | $DA_0$ $DB_0$ | HEXA DECIMAL |
|---|---|---|---|---|---|---|
| $A_0$ | $B_0$ | 0 | 0 | 0 | 0 | 0H |
| $A_1$ | $B_1$ | 0 | 0 | 0 | 1 | 1H |
| $A_2$ | $B_2$ | 0 | 0 | 1 | 0 | 2H |
| $A_3$ | $B_3$ | 0 | 0 | 1 | 1 | 3H |
| $A_4$ | $B_4$ | 0 | 1 | 0 | 0 | 4H |
| $A_5$ | $B_5$ | 0 | 1 | 0 | 1 | 5H |
| $A_6$ | $B_6$ | 0 | 1 | 1 | 0 | 6H |
| $A_7$ | $B_7$ | 0 | 1 | 1 | 1 | 7H |
| $A_8$ | $B_8$ | 1 | 0 | 0 | 0 | 8H |
| $A_9$ | $B_9$ | 1 | 0 | 0 | 1 | 9H |
| $A_{10}$ | $B_{10}$ | 1 | 0 | 1 | 0 | AH |
| $A_{11}$ | $B_{11}$ | 1 | 0 | 1 | 1 | BH |
| $A_{12}$ | $B_{12}$ | 1 | 1 | 0 | 0 | CH |
| $A_{13}$ | $B_{13}$ | 1 | 1 | 0 | 1 | DH |
| $A_{14}$ | $B_{14}$ | 1 | 1 | 1 | 0 | EH |
| $A_{15}$ | $B_{15}$ | 1 | 1 | 1 | 1 | FH |

B GROUP S.W.
A GROUP S.W.

TABLE 4

| INPUT | Ma Mb | $U/D_A$ $U/D_B$ | $DA_3$ $DB_3$ | $DA_2$ $DB_2$ | $DA_1$ $DB_1$ | $DA_0$ $DB_0$ | |
|---|---|---|---|---|---|---|---|
| | | 0 | 0 | 0 | 0 | 0 | Down |
| | | 0 | 0 | 0 | 0 | 1 | |
| | | 0 | 0 | 0 | 1 | 0 | |
| | | 0 | 0 | 0 | 1 | 1 | |
| | | 0 | 0 | 1 | 0 | 0 | |
| | | 0 | 0 | 1 | 0 | 1 | |
| | | 0 | 0 | 1 | 1 | 0 | |
| | | 0 | 0 | 1 | 1 | 1 | |
| | | 0 | 1 | 0 | 0 | 0 | |
| | | 0 | 1 | 0 | 0 | 1 | |
| | | 0 | 1 | 0 | 1 | 0 | |
| | | 0 | 1 | 0 | 1 | 1 | |
| | | 0 | 1 | 1 | 0 | 0 | |
| | | 0 | 1 | 1 | 0 | 1 | |
| | | 0 | 1 | 1 | 1 | 0 | |
| | | 0 | 1 | 1 | 1 | 1 | |
| | | 1 | 0 | 0 | 0 | 0 | Up |
| | | 1 | 0 | 0 | 0 | 1 | |
| | | 1 | 0 | 0 | 1 | 0 | |
| | | 1 | 0 | 0 | 1 | 1 | |
| | | 1 | 0 | 1 | 0 | 0 | |
| | | 1 | 0 | 1 | 0 | 1 | |
| | | 1 | 0 | 1 | 1 | 0 | |
| | | 1 | 0 | 1 | 1 | 1 | |
| | | 1 | 1 | 0 | 0 | 0 | |
| | | 1 | 1 | 0 | 0 | 1 | |
| | | 1 | 1 | 0 | 1 | 0 | |
| | | 1 | 1 | 0 | 1 | 1 | |
| | | 1 | 1 | 1 | 0 | 0 | |
| | | 1 | 1 | 1 | 0 | 1 | |
| | | 1 | 1 | 1 | 1 | 0 | |
| | | 1 | 1 | 1 | 1 | 1 | |
| OUTPUT | Na' Nb' | $DA_4'$ $DB_4'$ | $DA_3'$ $DB_3'$ | $DA_2'$ $DB_2'$ | $DA_1'$ $DB_1'$ | $DA_0'$ $DB_0'$ | |

TABLE 5

| $U/D_A$ $U/D_B$ | $DA_2$ $DA_2$ | $DA_1$ $DA_1$ | $DA_0$ $DA_0$ | Ma' Mb' | INPUT |
|---|---|---|---|---|---|
| 0 | 0 | 0 | 0 | 0 | Down |
| 0 | 0 | 0 | 0 | 1 | |
| 0 | 0 | 0 | 1 | 0 | |
| 0 | 0 | 0 | 1 | 1 | |
| 0 | 0 | 1 | 0 | 0 | |
| 0 | 0 | 1 | 0 | 1 | |
| 0 | 0 | 1 | 1 | 0 | |
| 0 | 0 | 1 | 1 | 1 | |
| 0 | 1 | 0 | 0 | 0 | Up |
| 0 | 1 | 0 | 0 | 1 | |
| 0 | 1 | 0 | 1 | 0 | |
| 0 | 1 | 0 | 1 | 1 | |
| 0 | 1 | 1 | 0 | 0 | |
| 0 | 1 | 1 | 0 | 1 | |
| 0 | 1 | 1 | 1 | 0 | |
| 0 | 1 | 1 | 1 | 1 | |

| $DA_4'$ $DB_4'$ | $DA_3'$ $DB_3'$ | $DA_2'$ $DB_4'$ | $DA_1'$ $DB_4'$ | $DA_0'$ $DB_0'$ | Na' Nb' | OUTPUT |
|---|---|---|---|---|---|---|

Figure 4:
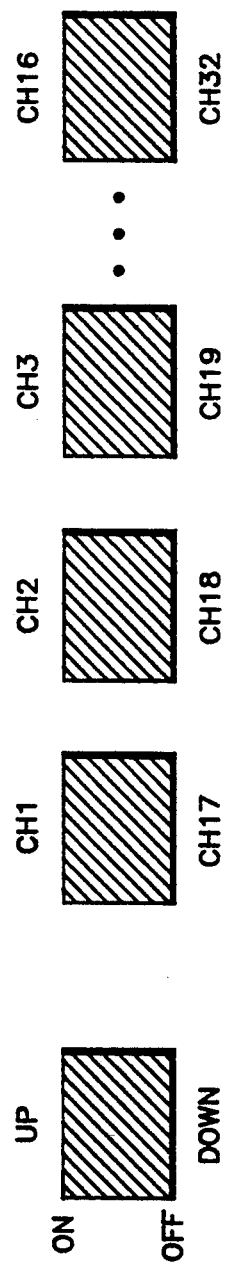
FIG. 4 is a schematic diagram of a switch arrangement for illustrating the operational modes of an up/down switch according to the present invention.

In Table 2, there are shown the operational modes of the switch according to the states of the option data $OP_1$, $OP_2$, $OP_3$ of the option switch. The functions of the up/down key are more easily understood with reference to FIG. 4. For example, if the second key from the left of the drawing is pushed with the up/down key turned-on, $CH_1$ is selected, while $CH_{32}$ is selected if the key rightmost on the drawing is pushed with the up/down key turned-off.

If the first data Ma is to be in the operational mode of 16U/D, 16, 8U/D the states of the option data $OP_1$, $OP_2$, $OP_3$ must be as shown in Table 2. Namely, $\overline{OP_1}$, $OP_1 \cdot \overline{OP_2}$ and $OP_1 \cdot OP_2$ should be logic "1" respectively for 16U/D, 16 and 8U/D modes. Of course, if the second data Mb is to be in the operational modes of 16U/D, 16, 8U/D modes, the states of the option data $OP_1$, $OP_2$, $OP_3$ must be as shown in FIG. 2. Namely, $\overline{OP_1} + \overline{OP_3}$, $OP_1 \cdot \overline{OP_2} \cdot OP_3$ and $OP_1 \cdot OP_2 \cdot OP_3$ should be logic "1" respectively for 16U/D, 16 and 8U/D modes.

The $\overline{OP_1}$, $OP_1 \cdot \overline{OP_2}$, $OP_1 \cdot OP_2$, $\overline{OP_1} + \overline{OP_3}$, $OP_1 \cdot \overline{OP_2} \cdot OP_3$, and $OP_1 \cdot OP_2 \cdot OP_3$ are obtained respectively by inverter G9, the combination of inverter G1 and AND gate G2, AND gate G3, the combination of inverters G9, G10 and G11, the combination of inverter G1 and AND gates G2, G15, and the combination of AND gates G3 and G13.

The option keys $OP_1$, $OP_2$, $OP_3$ and the up/down key of particular group are activated after pushing a desired one of the group A keys $A_0$–$A_{15}$ and the group B keys $B_0$–$B_{15}$ on the key matrix 12, so as to produce a corresponding scan data SD, of which the process is the same as in the conventional matrix switch. The scan data SD is decoded by scan decoder 14 to produce the first and second data Ma and Mb simultaneously with first and second clock signals LCKa and LCKb and option data DD. The first and second data Ma and Mb produced by scan decoder 14 are latched by first and second latch circuits 16 and 18, supplied to mode selection adder 20 which is applied with the up/down data $U/D_A$ and $U/D_B$ of 5-bit option data produced by scan decoder 14 and the option data $OP_1$, $OP_2$ and $OP_3$ as shown in Table 2.

When the first data Ma is in the 16U/D mode, the option data DD produced by scan decoder 14 has $OP_1$ of logic "0" and $OP_2$ and $OP_3$ of logic "don't care", as shown in Table 2. Hence, the output of inverter $G_9$ is logic "1", and the logic data combine $OP_1 \cdot U/D_A$ produced by AND gate $G_6$ is $DA_4'$. Further, the output data of OR gate $G_5$ is $OP_1 \cdot OP_2 \cdot U/D_A + OP_1 \cdot DA_3 + OP_1 \cdot OP_2 \cdot OP_3$, which is $0 + DA_3 + 0$, i.e. $DA_3$. Consequently, $DA_2', DA_1'$ and $DA_0'$ come to have respectively $DA_2$, $DA_1$ and $DA_0$. Here, the data format is as shown in Table 4.

If the first data Ma is 16U/D, $OP_1$, $OP_2$ and $OP_3$ are respectively logic "1", "0", and "don't care". Further, $DA_4'$ is $U/D_A \cdot \overline{OP_1}$ that is logic "0", and $DA_3'$ is $OP_1 \cdot OP_2 \cdot U/D_A + \overline{OP_1} \cdot DA_3 + OP_1 \cdot \overline{OP_2} \cdot DA_3$ that is $DA_3$. Finally, $DA_2'$, $DA_1'$ and $DA_0'$ come to have respectively $DA_2$, $DA_1$ and $DA_0$. Here, the data format is as shown in Table 3.

If the first data Ma is 8U/D, $OP_1$, $OP_2$ and $OP_3$ are respectively logic "1", "1" and "don't care". Further, $DA_4'$ is $U/D_A \cdot \overline{OP_1}$ that is logic "0", and $DA_3'$ is $OP_1 \cdot OP_2 \cdot U/D_A + \overline{OP_1} \cdot DA_3 + OP_1 \cdot \overline{OP_2} \cdot DA_3$ that is $DA_3$. Finally, $DA_2'$, $DA_1'$ and $DA_0$ come to have respectively $DA_2$, $DA_1$ and $DA_0$. Here, the data format is as shown in Table 3.

If the second data Mb is 16U/D, $OP_1$ or $OP_3$ is logic "0", and $OP_2$ is "don't care". Hence, the output of AND gate $G_{12}$ is $DB_4'$ that is $U/D_B \cdot (\overline{OP_1} + \overline{OP_3})$, i.e. $U/D_B$. Further, the output of OR gate $G_{16}$ is $DB_3'$ that is equated as follows:

$$DB_3' = OP_1 \cdot OP_2 \cdot U/D_B \cdot OP_3 + DB_3 \cdot (\overline{OP_1} + \overline{OP_3}) + OP_1 \cdot \overline{OP_2} \cdot DB_3 \cdot OP_3 = 0 + DB_3 + 0 = DB_3$$

Finally, $DB_2'$, $DB_1'$ and $DB_0'$ come to have respectively $DB_2$, $DB_1$ and $DB_0$. Here, the data format is as shown in Table 4.

If the second data Mb is 16U/D, $OP_1$, $OP_2$ and $OP_3$ are respectively logic "1", 0" and "1" Further, $DB_4'$ is $U/D_B \cdot (\overline{OP_1} + \overline{OP_3})$ that is 0, and $DB_3'$ is $OP_1 \cdot OP_2 \cdot U/D_B \cdot OP_3 + DB_3 \cdot (\overline{OP_1} + \overline{OP_3}) + OP_1 \cdot \overline{OP_2} \cdot DB_3 \cdot OP_3$ that is $DB_3$. Finally, $DB_2'$, $DB_1'$ and $DB_0'$ come to have respectively $DB_2$, $DB_1$ and $DB_0$. Here, the data format is as shown in Table 5. Thus, it will be noted that the first and second data Ma and Mb of a given bit produced by the scan decoder 14 are converted by the option data $U/D_A$, $U/D_B$, $OP_1$, $OP_2$, $OP_3$.

In the present embodiment, five options are taken for two data inputs of 4 bits, but it is self-evident that additional options may be used for the increase of the number of the data bits and inputs.

As described above, the present invention provides a circuit for obtaining a variety of key data modes without expanding the key matrix switch, and the circuit converts the input data into another given data format by operation of the mode selecting switches.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A circuit for converting scan data, comprising:
    a key matrix having a plurality of keys and a plurality of mode selecting switches for producing the scan data when one of the keys is activated, said plurality of keys being arranged in a matrix structure;
    a scan decoder for decoding said scan data to produce a mode selecting signal, first scan data, second scan data, and first and second clock signals respectively synchronized with said first and second scan data;
    first and second latch circuits for latching said first and second scan data according to said first and second clock signals; and
    a mode selecting adder for converting first and second latched output data of said first and second latch circuits into first and second connected data according to the mode selecting signal of said scan decoder, whereby scan data of different modes may be produced according to the operation of said mode selecting switches.

2. A can data conversion circuit as claimed in claim 1, characterized by said key matrix having a plurality of crossing rows and columns and one key at each of the cross points where said multiple rows cross said multiple columns.

3. A scan data conversion circuit as claimed in claim 1, wherein said mode selecting adder comprises:
    means for receiving said first and second latched output data of said first and second latch circuits;
    means for receiving said mode selecting signal of said scan decoder to determine an operational mode;
    means for converting said first and second latched output data into said first converted data according to said operational mode; and
    means for converting said first and second latched output data into said second converted scan data according to said operational mode.

4. The scan data conversion circuit of claim 1, wherein said mode selecting adder comprises:
    option data input lines for receiving said mode selecting signal;
    first input data lines for receiving said first latched output data;
    second input data lines for receiving said second latched output data;
    first and second converted scan data output means;
    first logical operation means for connecting said option data lines, said first input data lines and said first converted scan data output means;
    second logical operation means for connecting said option data lines, said second input data lines and said second converted scan data output means.

5. The scan data conversion circuit of claim 4, said option data input lines including:
    first and second key state input lines;
    said first key state input line connected to said first logical operation means; and
    said second key state input line connected to said second logical operation means.

6. The scan data conversion circuit of claim 4, said first and second logical operation means comprises:
    logic means for combining said first and second latched data with said mode selecting signal to produce said first and second converted data.

* * * * *

UNITED STATES PATENT AND TRADEMARK OFFICE
CERTIFICATE OF CORRECTION

PATENT NO. : 5,101,201
DATED : 31 March 1992
INVENTOR(S) : Woo-Sung CHOI

It is certified that error appears in the above-identified patent and that said Letters Patent is hereby corrected as shown below:

Claim 1, Column 6, Line 18, replace "connected" with --converted--.

Signed and Sealed this

Fifteenth Day of June, 1993

Attest:

MICHAEL K. KIRK

*Attesting Officer*     *Acting Commissioner of Patents and Trademarks*